US012796036B2

(12) United States Patent
Hagimoto et al.

(10) Patent No.: US 12,796,036 B2
(45) Date of Patent: Nov. 10, 2026

(54) SUBSTRATE FOR ELECTRONIC DEVICE AND METHOD FOR PRODUCING THE SAME

(71) Applicant: SHIN-ETSU HANDOTAI CO., LTD., Tokyo (JP)

(72) Inventors: Kazunori Hagimoto, Takasaki (JP); Kosei Sugawara, Nishigo-mura (JP); Ippei Kubono, Annaka (JP); Hiroji Aga, Takasaki (JP); Toru Ishizuka, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 327 days.

(21) Appl. No.: 18/715,417

(22) PCT Filed: Oct. 31, 2022

(86) PCT No.: PCT/JP2022/040820
§ 371 (c)(1),
(2) Date: May 31, 2024

(87) PCT Pub. No.: WO2023/100577
PCT Pub. Date: Jun. 8, 2023

(65) Prior Publication Data

US 2025/0031421 A1 Jan. 23, 2025

(30) Foreign Application Priority Data

Dec. 1, 2021 (JP) ................................ 2021-195583
Jun. 17, 2022 (JP) ................................ 2022-097956

(51) Int. Cl.
*H10D 62/40* (2025.01)
*H10P 14/20* (2026.01)
*H10P 90/00* (2026.01)

(52) U.S. Cl.
CPC ....... *H10D 62/405* (2025.01); *H10P 14/2905* (2026.01); *H10P 14/2926* (2026.01); *H10P 14/3416* (2026.01); *H10P 90/1914* (2026.01)

(58) Field of Classification Search
CPC ...... C30B 25/18; C30B 29/38; H10D 62/405; H10P 14/2905; H10P 14/2926; H10P 14/3258; H10P 14/3416; H10P 90/1914
See application file for complete search history.

(56) References Cited

U.S. PATENT DOCUMENTS

2016/0315220 A1* 10/2016 Cheng ................ H10H 20/0133
2019/0006171 A1 1/2019 Dasgupta et al.
(Continued)

FOREIGN PATENT DOCUMENTS

JP S63-193517 A 8/1988
JP 7-335511 * 12/1995 ............ H01L 21/02
(Continued)

OTHER PUBLICATIONS

Jan. 10, 2023 International Search Report issued in International Application No. PCT/JP2022/040820.
(Continued)

*Primary Examiner* — Kevin Parendo
(74) *Attorney, Agent, or Firm* — Oliff PLC

(57) ABSTRACT

A substrate for an electronic device, including a nitride semiconductor film formed on a bonded substrate of a silicon single crystal, in which the bonded substrate is a substrate including a first silicon single-crystal substrate having a crystal plane orientation of {111} and a second silicon single-crystal substrate having a crystal plane orientation of {100} being bonded via an oxide film, the first substrate is formed with a notch in <110> direction, the second substrate is formed with a notch in <011> direction or <001> direction, the <110> direction of the first substrate
(Continued)

First Silicon Single-Crystal Substrate
Crystal Plane Orientation {111}
Notch Position $[1\bar{1}0]$ Second Silicon Single-Crystal Substrate
Crystal Plane Orientation {100}
Notch Position $[0\bar{1}1]$ Laminating Cleaved Planes of Silicon Single-Crystal Bonded substrate and the <011> direction of the second substrate are bonded in an angular range of −15° to 15°, and the nitride semiconductor film is formed on a surface of the first substrate of the bonded substrate.

4 Claims, 2 Drawing Sheets

(56) References Cited

U.S. PATENT DOCUMENTS

| | | | |
|---|---|---|---|
| 2022/0238326 A1 | 7/2022 | Hagimoto et al. | |
| 2022/0367188 A1 | 11/2022 | Hagimoto et al. | |
| 2025/0273587 A1* | 8/2025 | Hagimoto | C30B 25/183 |

FOREIGN PATENT DOCUMENTS

| | | | |
|---|---|---|---|
| JP | H07-335511 | A | 12/1995 |
| JP | 2017-507478 | A | 3/2017 |
| JP | 2021-014376 | A | 2/2021 |
| JP | 2021-027186 | A | 2/2021 |

OTHER PUBLICATIONS

Jun. 13, 2024 International Preliminary Report on Patentability issued in International Application No. PCT/JP2022/040820.

Aug. 24, 2026 Search Report issued in European Patent Application No. 22901010.3.

* cited by examiner

[FIG. 1]
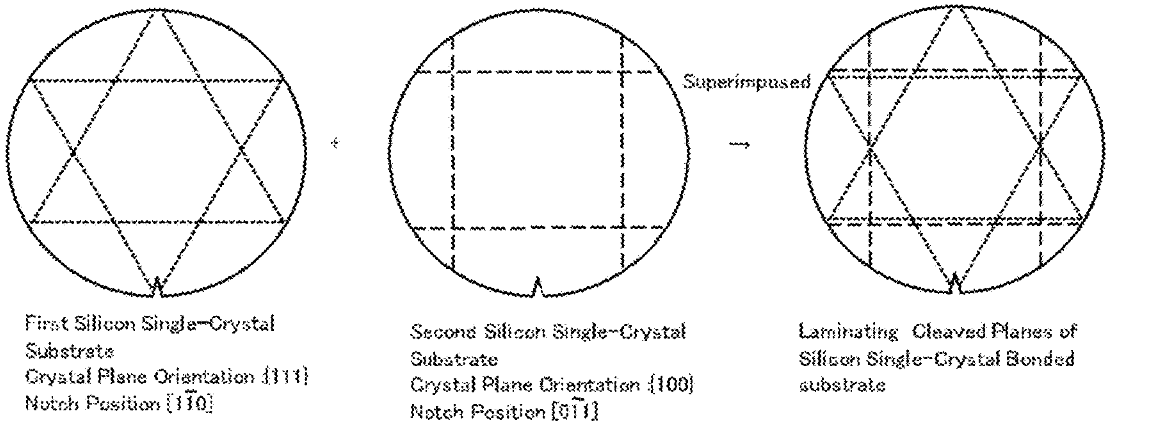
[FIG. 2]
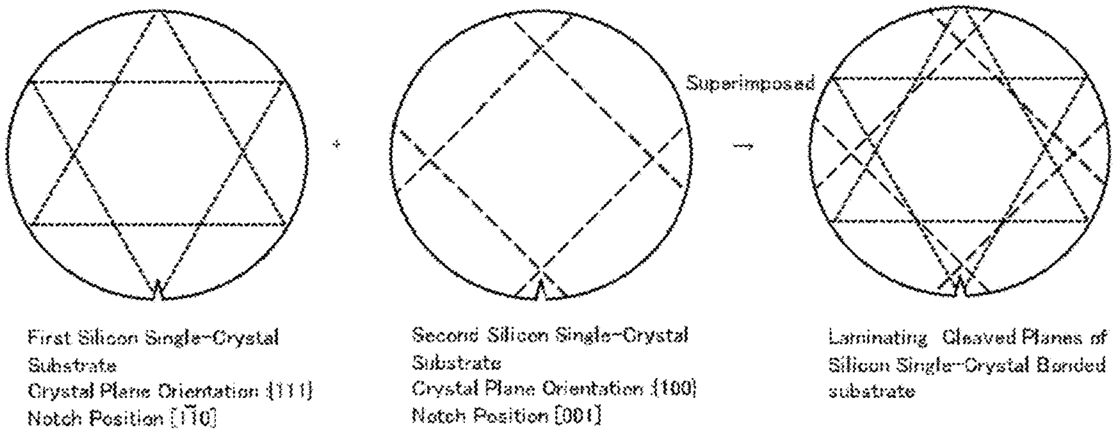
[FIG. 3]
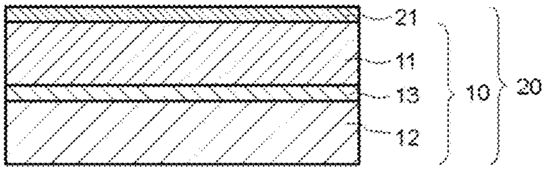

[FIG. 4]
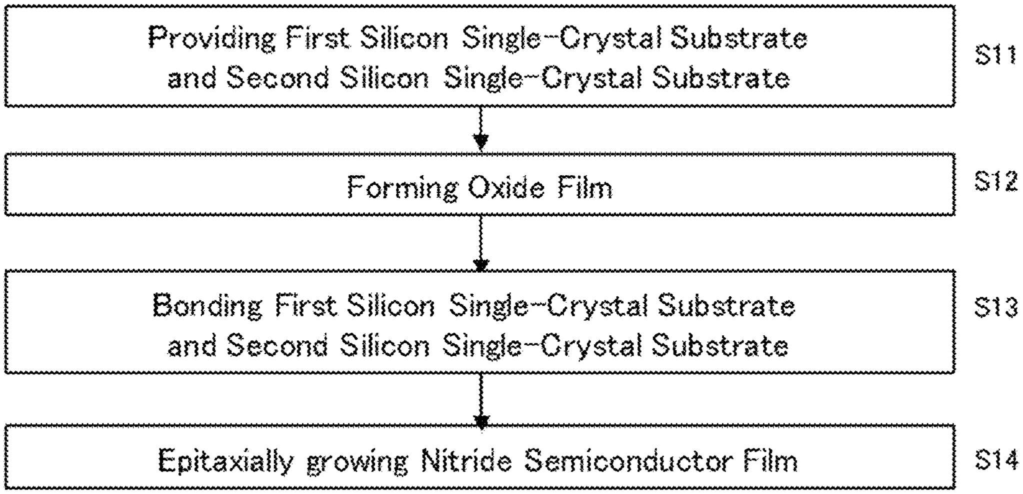
[FIG. 5]
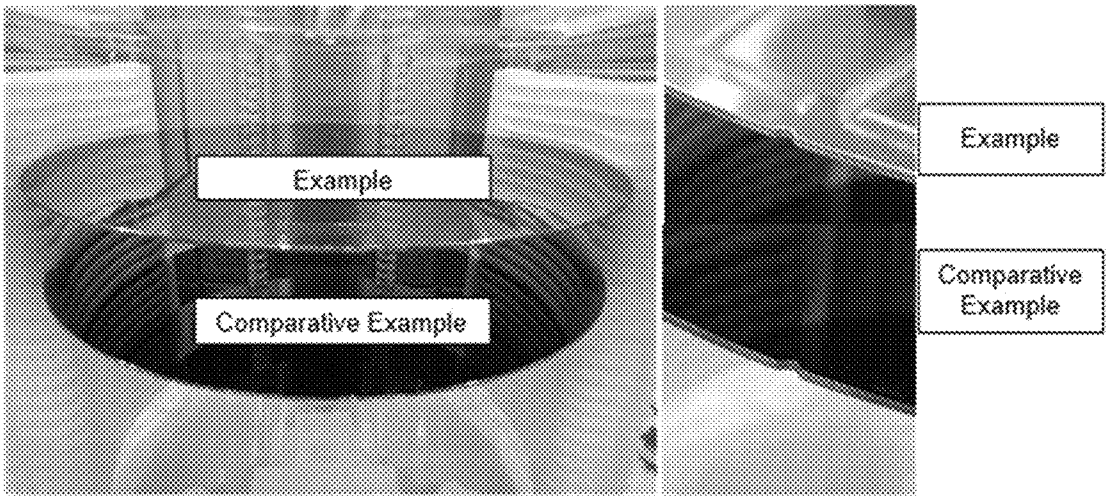
[FIG. 6]
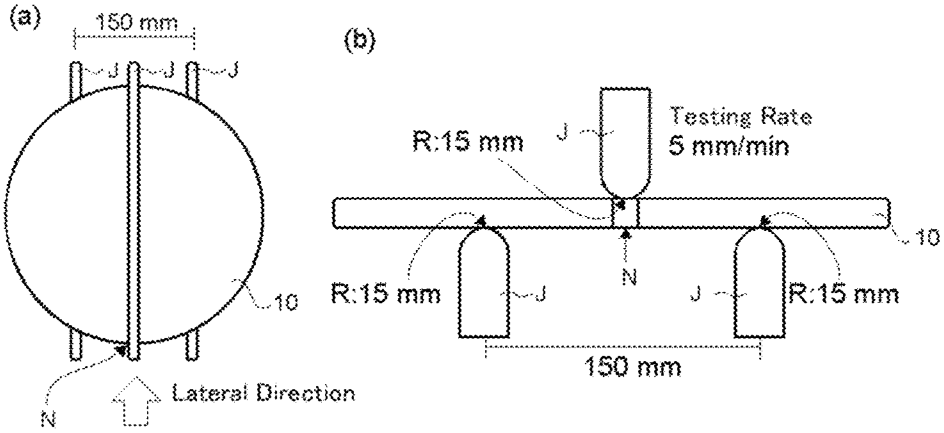

SUBSTRATE FOR ELECTRONIC DEVICE AND METHOD FOR PRODUCING THE SAME

TECHNICAL FIELD

The present invention relates to a substrate for an electronic device and a method for producing the same, in particular, a substrate for an electronic device where a nitride semiconductor is formed on a silicon substrate and a method for producing the same.

BACKGROUND ART

Nitride semiconductors, including GaN and AlN, can be used for fabricating high electron mobility transistors (HEMT) and electronic devices with a high breakdown voltage that use two-dimensional electron gas.

It is difficult to produce a nitride semiconductor wafer having a nitride semiconductor grown on a substrate, and a sapphire substrate or a SiC substrate is conventionally used as a growth substrate. However, in order to suppress costs for achieving a larger diameter substrate (diameter enlargement) and costs for a substrate, epitaxial growth of a nitride semiconductor by vapor phase growth on a silicon single-crystal substrate has been employed. When an epitaxially grown film of the nitride semiconductor is produced by vapor phase growth on a silicon single-crystal substrate, a substrate with a larger diameter can be used compared to a sapphire substrate or a SiC substrate; thus, the productivity of devices is high, and there are advantages regarding ease of processing. However, due to stress caused by a difference in lattice constant or a difference in thermal expansion coefficient, an increase in warps, slips, cracks, and the like easily occurs at the vapor phase growth on the nitride semiconductor on the silicon single-crystal substrate. Therefore, stress reduction is carried out through growth conditions and a relief layer.

In particular, in order to make epitaxial substrates for power devices to have high breakdown voltage, it is necessary to produce GaN on Si (GaN on a silicon single-crystal) in which an epitaxial layer of GaN has increased thickness. To increase the thickness of the epitaxial layer, the silicon single-crystal substrate, being the growth substrate, may be thickened and epitaxially grown. In addition, as a method to thicken the silicon single-crystal substrate, bonding of two silicon single-crystal substrates has been conducted. Patent Document 1 discloses the thickness of a bonded substrate of 2 mm or more. Moreover, Patent Document 2 discloses a combination of two substrates to be bonded, including a bond wafer having a plane orientation of {111} and a resistivity of 1 kΩcm or more, and a base wafer having a plane orientation of {100} and a resistivity of 0.1 Ωcm or less.

CITATION LIST

Patent Literature

Patent Document 1: JP 2021-014376 A
Patent Document 2: JP 2021-027186 A

SUMMARY OF INVENTION

Technical Problem

As described above, the use of bonded substrates as growth substrates is known as disclosed in Patent Document 1 and Patent Document 2. However, even if these bonded substrates are used, it has not been possible to completely suppress an increase in the warp and generation of the slip, the crack, and the like. Moreover, the slip, the crack, and the like have often generated mainly at a notch of a {111} silicon single-crystal substrates being epitaxially grown. Generally, the notch is formed in <110> direction on the {111} silicon single-crystal substrate and formed in <011> direction or <001> direction on a {100} silicon single-crystal substrate.

The present invention has been made to solve the above-described problem. An object of the present invention is to provide a substrate for an electronic device, including a nitride semiconductor formed on a silicon single-crystal, which is the substrate for the electronic device with the suppressed generation of the slip, the crack, and the like, and with a high break strength, and a method for producing the substrate.

Solution to Problem

To solve the problem described above, the present invention provides a substrate for an electronic device, comprising a nitride semiconductor film formed on a bonded substrate comprising a silicon single crystal, wherein the bonded substrate is a substrate comprising a first silicon single-crystal substrate having a crystal plane orientation of {111} and a second silicon single-crystal substrate having a crystal plane orientation of {100} being bonded via an oxide film, the first silicon single-crystal substrate is formed with a notch in <110> direction, the second silicon single-crystal substrate is formed with a notch in <011> direction or <001> direction, the <110> direction of the first silicon single-crystal substrate and the <011> direction of the second silicon single-crystal substrate are bonded in an angular range of −15° to 15°, and the nitride semiconductor film is formed on a surface of the first silicon single-crystal substrate of the bonded substrate.

Such a substrate for an electronic device can be the substrate for the electronic device in which the generation of the slip, the crack, and the like is suppressed, and thus, a breaking strength is high, owing to a positional relationship between a cleaved plane of the first silicon single-crystal substrate and that of the second silicon single-crystal substrate.

In this case, the bonded substrate can have a diameter of 300 mm or larger.

In this way, the inventive substrate having high breaking strength is particularly effective for the substrate for the electronic device having a large diameter such as a diameter of 300 mm or larger.

Moreover, the present invention provides a method for producing a substrate for an electronic device by forming a nitride semiconductor film on a bonded substrate comprising a silicon single crystal, the method comprising the steps of:

providing a first silicon single-crystal substrate having a notch formed in <110> direction and a crystal plane orientation of {111}, and a second silicon single-crystal substrate having a notch formed in <011> direction or <001> direction and a crystal plane orientation of {100};

forming an oxide film by thermally oxidizing on a surface of at least one of the first silicon single-crystal substrate and the second silicon single-crystal substrate;

producing the bonded substrate by laminating the first silicon single-crystal substrate and the second silicon single-crystal substrate via the oxide film so as to make the <110> direction of the first silicon single-crystal substrate and the <011> direction of the second silicon single-crystal substrate in an angular range of −15° to 15°, and then heat treating to bond the first silicon single-crystal substrate and the second silicon single-crystal substrate; and epitaxially growing the nitride semiconductor film on a surface of the first silicon single-crystal substrate of the bonded substrate.

Such a method for producing the substrate for the electronic device can produce the substrate for the electronic device having a high breaking strength in which the generation of the slip, the crack, and the like are suppressed owing to a positional relationship between a cleaved plane of the first silicon single-crystal substrate to be bonded and that of the second silicon single-crystal substrate to be bonded.

In this case, the first silicon single-crystal substrate to be provided and the second silicon single-crystal substrate to be provided can have a diameter of 300 mm or larger.

The substrate having the high breaking strength, such as the substrate for an electronic device produced by the inventive producing method, is particularly effective for producing the substrate for the electronic device having a large diameter, such as a diameter of 300 mm or larger.

Advantageous Effects of Invention

According to the inventive substrate for the electronic device and the method for manufacturing the same, the substrate for an electronic device can be provided with high breaking strength, suppressing the generation of cracks and the like owing to the positional relationship between the cleaved plane of the first silicon single-crystal substrate and that of the second silicon single-crystal substrate.

BRIEF DESCRIPTION OF DRAWINGS

FIG. 1 is a schematic view illustrating an example of a cleaved plane of a first silicon single-crystal substrate and that of a second silicon single-crystal substrate of a substrate for an electronic device according to the present invention.

FIG. 2 is a schematic view illustrating an example of a cleaved plane of a first silicon single-crystal substrate and that of a second silicon single-crystal substrate in Comparative Example.

FIG. 3 is a schematic cross-sectional view illustrating an example of a substrate for an electronic device according to the present invention.

FIG. 4 is a flowchart illustrating a schematic of an example of a method for producing a substrate for an electronic device according to the present invention.

FIG. 5 is a photograph of a state in which two silicon single-crystal substrates are laminated and heat treated in Example and Comparative Example.

FIG. 6 is a schematic view illustrating a state of breaking load test and bending strength test.

DESCRIPTION OF EMBODIMENTS

Hereinafter, the present invention will be described in detail; however, the present invention is not limited thereto.

As described above, in order to make an epitaxial substrate for a power device high in withstand voltage, it is necessary to produce a substrate for an electronic device in which a nitride semiconductor film is thickly formed on a silicon single-crystal substrate (for example, GaN on Si in which a GaN epitaxial layer has a thickened thickness). In order to thicken the thickness of the epitaxial layer, the silicon single-crystal substrate may be thickened to grow epitaxially. In addition, as a method to thicken a silicon substrate, the bonding of two silicon single-crystal substrates has been performed; even if the bonded substrate is used, a complete suppression of a slip, a crack, and the like has not been possible.

The present inventors examine thoroughly a substrate for an electronic device with a suppressed generation of the slip, the crack, etc., and thus having a high breaking strength; and found that, in the substrate for the electronic device in which a nitride semiconductor film is formed on a bonded substrate of silicon single crystal; by using two silicon single-crystal substrates being bonded as a base substrate (seed crystal), and more, by shifting not only crystal plane orientations of main surfaces of two silicon single-crystal substrates but also cleaved planes of each substrate; the substrate for the electronic device can be made with a suppressed generation of the slip, the crack, etc., and thus have a high breaking strength. This led to the completion of the present invention.

Substrate for Electronic Device

The present invention is a substrate for an electronic device, comprising a nitride semiconductor film formed on a bonded substrate comprising a silicon single crystal, wherein the bonded substrate is a substrate comprising a first silicon single-crystal substrate having a crystal plane orientation of {111} and a second silicon single-crystal substrate having a crystal plane orientation of {100} being bonded via an oxide film, the first silicon single-crystal substrate is formed with a notch in <110> direction, the second silicon single-crystal substrate is formed with a notch in <011> direction or <001> direction, the <110> direction of the first silicon single-crystal substrate and the <011> direction of the second silicon single-crystal substrate are bonded in an angular range of −15° to 15°, and the nitride semiconductor film is formed on a surface of the first silicon single-crystal substrate of the bonded substrate.

Hereinafter, the present invention is described in detail using the drawings.

As shown in FIG. 3, the inventive substrate for an electronic device 20 has a nitride semiconductor film 21 formed on a bonded substrate 10 of silicon single crystal. In the description of the present invention, the bonded substrate 10 of silicon single crystal is also referred to simply as “bonded substrate.” In this case, the bonded substrate 10 is the substrate in which a first silicon single-crystal substrate 11 having a crystal plane orientation of {111} and a second silicon single-crystal substrate 12 having a crystal plane orientation of {100} are bonded via an oxide film 13. In addition, the first silicon single-crystal substrate 11 is formed with a notch in <110> direction, and the second silicon single-crystal substrate 12 is formed with a notch in <011> direction or <001> direction. Moreover, the bonded substrate 10 is bonded in which <110> direction of the first silicon single-crystal substrate 11 and <011> direction of the second silicon single-crystal substrate 12 has the angular range of −15° to 15°.

Note that, in this description, a line above the number commonly used in the Miller index notation is substituted by a "–" in front of a number. That is, for example, the notation [1-10] is synonymous with:

$[1\,\bar{1}\,0]$

Other Miller index notations are used in the usual way. That is, { } means a general term for equivalent crystal plane orientations, and ( ) means each direction of the crystal plane orientations. In addition, < > indicates a general term for equivalent crystal axis directions, and [ ] means each direction of crystal axis directions.

A state of bonding of the first silicon single-crystal substrate 11 and the second silicon single-crystal substrate 12 is described by referring to FIG. 1, a drawing seen from the main surface side of each substrate. In this context, an example in which the substrate having the crystal plane orientation of {111} and the notch at [1-10] position is the first silicon single-crystal substrate 11, and the substrate having the crystal plane orientation of {100} and the notch at [0-11] position is the second silicon single-crystal substrate 12 is described.

In FIG. 1, the cleaved plane of the first silicon single-crystal substrate 11 is schematically shown by a dotted line, and the cleaved plane of the second silicon single-crystal substrate 12 is schematically shown by a dashed line, respectively. As shown in FIG. 1, when the first silicon single-crystal substrate 11 and the second silicon single-crystal substrate 12 are laminated, it is found that cleaved planes in the vertical direction of the drawing are shifted. Although the cleaved planes in the lateral direction of the drawing are overlapped, as for the entire bonded substrate 10, the effect of the shift of the cleaved planes in the vertical direction of the drawing improves the substrate strength of the bonded substrate 10. As a result, even in the presence of the nitride semiconductor film 21 formed on a surface of the first silicon single-crystal substrate 11 of the bonded substrate 10, the substrate for the electronic device 20 can be made with high breaking strength in which the generation of the slip, the crack and the like is suppressed.

Moreover, in the inventive substrate for the electronic device 20, the nitride semiconductor film 21 is formed on the surface of the first silicon single-crystal substrate 11 having the crystal plane orientation of {111}, thus an excellent nitride semiconductor film 21 is formed.

In FIG. 2, an example of a bonded substrate, which is not of the present invention, is shown. In FIG. 2, a substrate having a crystal plane orientation of {111} and a notch at [1-10] position is used as a first silicon single-crystal substrate, and a substrate having a crystal plane orientation of {100} and a notch at position is used as a second silicon single-crystal substrate to describe thereof as an example. In this case, although the crystal axis direction of the formed notch of the second silicon single-crystal substrate differs from the case in FIG. 1, others are the same as in FIG. 1. As can be seen in FIG. 2, when the first silicon single-crystal substrate 11 and the second silicon single-crystal substrate 12 are laminated, the cleaved planes are all in close proximity to each other. Even in a case like FIG. 2, because two silicon single-crystal substrates with crystal plane orientation of {111} and {100}, respectively, are bonded, thus the strength of the bonded substrate and the substrate for the electronic device is intensified, but the strength is lesser than that of the case in FIG. 1, which shows the present invention.

The present inventors further perform the following experiments in order to investigate breaking load and bending strength at angular ranges between FIG. 1 and FIG. 2.

From a state in which a notch of a silicon single-crystal substrate with a notch formed on <110> direction and a crystal plane orientation of {111}, and that of a silicon single-crystal substrate with a notch on <011> direction and a crystal plane orientation of {100} coincide, i.e., an angle between the <110> direction of the {111} silicon single-crystal substrate and the <011> direction of the {100} silicon single-crystal substrate is in a state of 0°, and angles are shifted to 5°, 10°, 15°, 20°, 30°, 40°, 45° to investigate respective breaking load.

In this strength measurement of the bonded substrate, as shown in FIG. 6, breaking load and bending strength are investigated using Universal Testing System manufactured by INSTRON Corporation. FIG. 6 (*b*) is a side view from lateral direction of FIG. 6 (*a*), which is a top view from the vertical direction.

As shown in FIGS. 6 (*a*) and (*b*), three fulcrum jigs J (curvature radius R of crimping points is 15 mm) are arranged above and below the bonded substrate. In the bonded substrate, the notch position of the {111} silicon single-crystal substrate is weak in terms of strength, thus, the notch position N of the {111} silicon single-crystal substrate is arranged to be just below the central fulcrum jig J (see FIGS. 6(*a*) and (*b*)). The formula for the bending strength is as follows.

$$\text{Bending strength} = 3PL/2WT^2 \qquad \text{(Formula)}$$

P: Breaking load,
L=Span (150 mm)
W: Width 300 mm
T: Thickness 1.55 mm

The result of the investigation is shown in Table 1.

TABLE 1

| Angle | 0° | 5° | 10° | 15° | 20° | 30° | 40° | 45° |
|---|---|---|---|---|---|---|---|---|
| Breaking Load [N] | 1013 | 985 | 970 | 950 | 845 | 800 | 780 | 756 |
| Bending Strength [MPa] | 316 | 307 | 303 | 297 | 264 | 300 | 243 | 236 |

In this way, it is found that the substrate in which the <110> direction of the {111} silicon single-crystal substrate and the <011> direction of the {100} silicon single-crystal substrate are bonded within the angular range of −15° to 15° (0° to 15° and 15° to 0° are equivalent from crystal symmetry) has an increased breaking load and bending strength resulting in the high substrate strength.

In the inventive substrate for the electronic device 20, the diameter of the bonded substrate 10 (and the substrate for the electronic device 20) can also be made as large as 300 mm or larger because of the high substrate strength, as described above. Conventionally, the substrate having such a large diameter has a case where the substrate strength is insufficient, and the slip, the crack, and the like are generated; however, the inventive substrate for the electronic device can be made with high breaking strength, which suppresses these factors. The upper limit of the diameter of the bonded substrate 10 (and the substrate for the electronic device 20) is not particularly limited but can be, for example, 450 mm or smaller.

When the diameter of the bonded substrate 10 (and the substrate for the electronic device 20) is 300 mm or larger, the diameters of the first silicon single-crystal substrate 11 and the second silicon single-crystal substrate 12 are also 300 mm or larger. The respective thickness of the first silicon single-crystal substrate 11 and the second silicon single-crystal substrate 12 is not particularly limited but can be suitably used in accordance with standards. In particular, when the diameter is 300 mm, the thickness can be 775 μm. Such a silicon single-crystal substrate is used as a general substrate for a device, is inexpensive, and can be used without particular problems. As thicknesses of the first silicon single-crystal substrate 11 and the second silicon single-crystal substrate 12, the substrate having a thickness of 500 μm to 1500 μm can be used, for example.

Method for Producing Substrate for Electronic Device

Hereinafter, the inventive method for producing a substrate for an electronic device 20 described above is described referring to FIG. 4.

First, as shown in S11 of FIG. 4, a first silicon single-crystal substrate 11 and a second silicon single-crystal substrate 12 are provided (Step S11). In this case, a silicon single-crystal substrate having a crystal plane orientation of {111} and a notch formed in <110> direction is provided as the first silicon single-crystal substrate 11. In addition, a silicon single-crystal substrate having a crystal plane orientation of {100} and a notch formed in <011> direction or <001> direction is provided as the second silicon single-crystal substrate 12. In this case, the diameters of the provided first silicon single-crystal substrate and the provided second silicon single-crystal substrate can be 300 mm or larger.

Moreover, the first silicon single-crystal substrate 11 and the second silicon single-crystal substrate 12 are bonded to make a bonded substrate 20, which is one slice of silicon single-crystal substrate, so the first silicon single-crystal substrate 11 can be referred to as a bond wafer, and the second silicon single-crystal substrate 12 can be referred to as a base wafer.

The respective thickness of the first silicon single-crystal substrate 11 and the second silicon single-crystal substrate 12 is not particularly limited but can be suitably used in accordance with standards. Moreover, the respective resistivity and impurity concentration of the first silicon single-crystal substrate 11 and the second silicon single-crystal substrate 12 can be determined as appropriate.

Next, as shown in S12 of FIG. 4, at least one of the first silicon single-crystal substrate 11 and the second silicon single-crystal substrate 12 is thermally oxidized to form an oxide film on a surface (Step S12). The oxide film formed here is a film to be an oxide film 13, as shown in FIG. 3 after bonding of both silicon single-crystal substrates. The forming method of the oxide film is not particularly limited, but, for example, the oxide film with a thickness of about 100 nm can be formed on the surface of the substrate by oxidation heat treatment. The thickness of the oxide film is not particularly limited but, for example, can be 10 nm or more and 1000 nm or less. The oxide film may be formed on each of two silicon single-crystal substrates, or the oxide film may be formed on any one of silicon single-crystal substrates.

Next, as shown in S13 of FIG. 4, the first silicon single-crystal substrate 11 and the second silicon single-crystal substrate 12 are bonded (Step S13). In this case, the first silicon single-crystal substrate 11 and the second silicon single-crystal substrate 12 are laminated so as to have an angular range of −15° to 15° between <110> direction of the first silicon single-crystal substrate 11 and the <011> direction of the second silicon single-crystal substrate 12. In that case, both silicon single-crystal substrates are laminated via the oxide film formed in Step S12. By performing heat treatment in this state, the first silicon single-crystal substrate 11 and the second silicon single-crystal substrate 12 are bonded to produce the bonded substrate 10 (see FIG. 3).

Conditions (atmosphere, temperature, time, and the like) for heat treatment (bonding heat treatment) are not particularly limited as long as the first silicon single-crystal substrate 11 and the second silicon single-crystal substrate 12 can be bonded. The bonding heat treatment can be of the temperature of the bonding heat treatment, for example, at 400° C. or higher and 1200° C. or lower in a nitrogen atmosphere for 1 to 12 hours.

After this bonding heat treatment, it is preferred to clean a surface of the bonded substrate 10 before the epitaxial growth of a nitride semiconductor film described later. In particular, it is preferred to remove the oxide film generated on the surface of the bonded substrate 10 (in particular, the surface of the first silicon single-crystal substrate 11) by hydrofluoric acid spin cleaning, etc.

In this way, after the bonding of the first silicon single-crystal substrate 11 and the second silicon single-crystal substrate 12 to produce the bonded substrate 10, as shown in S14 in FIG. 4, the nitride semiconductor film 21 (see FIG. 3) is epitaxially grown on the surface of the first silicon single-crystal substrate 11 of the bonded substrate 10 (Step S14). As the nitride semiconductor film 21, such as an AlN layer, a GaN layer and an AlGaN layer can be formed. This nitride semiconductor film 21 can be formed by a common method. Moreover, an intermediate layer (buffer layer) can be formed as appropriate. In this way, the substrate for an electronic device 20 can be produced, as shown in FIG. 3.

EXAMPLE

Hereinafter, the present invention will be specifically described with showing Example and Comparative Example. However, the present invention is not limited to Example described below.

Example

In accordance with an inventive method for producing a substrate for an electronic device shown in FIG. 4, a substrate for an electronic device 20 shown in FIG. 3 was produced.

First, as a first silicon single-crystal substrate 11, a double-side polished silicon single-crystal substrate having a diameter of 300 mm, a thickness of 775 μm, a crystal plane orientation of {111}, and a resistivity of 5500 Ωcm with a notch formed in [1-10] direction was provided; and as a second silicon single-crystal substrate 12, a double-side polished silicon single-crystal substrate having a diameter of 300 mm, a thickness of 775 μm, a crystal plane orientation of {100}, and a resistivity of 10 Ωcm with a notch formed in [0-11] direction was provided (Step S11). Such a second silicon single-crystal substrate 12 is sometimes referred to as a “0° notch substrate”. This first silicon single-crystal substrate 11 and second silicon single-crystal substrate 12 have cleaved planes, respectively, as shown in FIG. 1 as a schematic view.

These provided two silicon single-crystal substrates were processed with oxidation heat treatment to form an oxide film having a thickness of 100 nm, respectively (Step S12).

Next, two silicon single-crystal substrates were bonded by aligning the notch positions and then performed bonding heat treatment at 500° C. in a nitrogen atmosphere (see FIG. 5) to produce a bonded substrate 10 (Step S13). Subsequently, hydrofluoric acid spin cleaning was performed on the bonded substrate 10 to remove the oxide film on the surface.

Next, an AlN layer of 150 nm, an AlGaN layer of 160 nm, a superlattice structure with 50 alternating pairs of GaN layers and AlN layers laminated, a GaN layer of 1000 nm, an AlGaN layer of 20 nm, and a GaN layer of 3 nm were epitaxially grown to a total thickness of 1.8 μm on the surface of the first silicon single-crystal substrate 11 of the bonded substrate 10 as a nitride semiconductor film 21 (Step S14).

As a result, GaN was successfully formed without cracking, slipping, etc. Consequently, the substrate for the electronic device 20 was produced.

Comparative Example

As described below, a substrate for an electronic device was produced in the same way as in Example, except that a substrate having a notch formed with a different crystal axis direction from Example was used as a second silicon single-crystal substrate.

First, as a first silicon single-crystal substrate, a double-side polished silicon single-crystal substrate having a diameter of 300 mm, a thickness of 775 μm, a crystal plane orientation of {111}, a resistivity of 5500 Ωcm with a notch formed in [1-10] direction was provided; and as a second silicon single-crystal substrate 12, a double-side polished silicon single-crystal substrate having a diameter of 300 mm, a thickness of 775 μm, a crystal plane orientation of {100}, a resistivity of 21 Ωcm with a notch formed in direction was provided.

Such a second silicon single-crystal substrate is sometimes referred to as a “45° notch substrate”. This first silicon single-crystal substrate and second silicon single-crystal substrate had cleaved planes, respectively, as shown in FIG. 2 as a schematic view.

These provided two silicon single-crystal substrates were processed with oxidation heat treatment to form oxide films having a thickness of 100 nm, respectively.

Next, two silicon single-crystal substrates were bonded by aligning the notch positions and then performed bonding heat treatment at 500° C. in a nitrogen atmosphere (see FIG. 5) to produce a bonded substrate. In addition, as shown in FIG. 5, this heat treatment step was performed simultaneously with the bonding heat treatment step in Example. Subsequently, hydrofluoric acid spin cleaning was performed on the bonded substrate 10 to remove the oxide film on the surface.

Next, a GaN film was epitaxially grown as a nitride semiconductor film on a surface of the first silicon single-crystal substrate of the bonded substrate under the same condition as in Example.

As a result, GaN was successfully formed, but a slip was generated in the notch portion.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A substrate for an electronic device, comprising a nitride semiconductor film formed on a bonded substrate comprising a silicon single crystal, wherein the bonded substrate is a substrate comprising a first silicon single-crystal substrate having a crystal plane orientation of {111} and a second silicon single-crystal substrate having a crystal plane orientation of {100} being bonded via an oxide film, the first silicon single-crystal substrate is formed with a notch in <110> direction, the second silicon single-crystal substrate is formed with a notch in <011> direction or <001> direction, the <110> direction of the first silicon single-crystal substrate and the <011> direction of the second silicon single-crystal substrate are bonded in an angular range of −15° to 15°, and the nitride semiconductor film is formed on a surface of the first silicon single-crystal substrate of the bonded substrate.

2. The substrate for the electronic device according to claim 1, wherein the bonded substrate has a diameter of 300 mm or larger.

3. A method for producing a substrate for an electronic device by forming a nitride semiconductor film on a bonded substrate comprising a silicon single crystal, the method comprising the steps of:

providing a first silicon single-crystal substrate having a notch formed in <110> direction and a crystal plane orientation of {111}, and a second silicon single-crystal substrate having a notch formed in <011> direction or <001> direction and a crystal plane orientation of {100};

forming an oxide film by thermally oxidizing on a surface of at least one of the first silicon single-crystal substrate and the second silicon single-crystal substrate;

producing the bonded substrate by laminating the first silicon single-crystal substrate and the second silicon single-crystal substrate via the oxide film so as to make the <110> direction of the first silicon single-crystal substrate and the <011> direction of the second silicon single-crystal substrate in an angular range of −15° to 15°, and then heat treating to bond the first silicon single-crystal substrate and the second silicon single-crystal substrate; and epitaxially growing the nitride semiconductor film on a surface of the first silicon single-crystal substrate of the bonded substrate.

4. The method for producing the substrate for the electronic device according to claim 3, wherein the first silicon single-crystal substrate and the second silicon single-crystal substrate to be provided have diameters of 300 mm or larger.

* * * * *